(12) United States Patent
Ishibashi

(10) Patent No.: US 10,625,308 B2
(45) Date of Patent: Apr. 21, 2020

(54) CLEANING DEVICE, METHOD OF MANUFACTURING THE SAME AND SUBSTRATE CLEANING APPARATUS

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 272 days.

(21) Appl. No.: 15/480,678

(22) Filed: Apr. 6, 2017

(65) Prior Publication Data

US 2017/0209902 A1 Jul. 27, 2017

Related U.S. Application Data

(63) Continuation of application No. 14/944,551, filed on Nov. 18, 2015, now Pat. No. 9,643,216.

(30) Foreign Application Priority Data

Nov. 20, 2014 (JP) .................. 2014-235191

(51) Int. Cl.
  *B08B 11/00* (2006.01)
  *H01L 21/67* (2006.01)
  (Continued)

(52) U.S. Cl.
  CPC ............. *B08B 1/04* (2013.01); *A46B 9/005* (2013.01); *A46B 13/02* (2013.01); *B08B 1/003* (2013.01);
  (Continued)

(58) Field of Classification Search
  CPC ... B08B 11/00; B08B 11/02; H01L 21/67046; H01L 21/68735
  See application file for complete search history.

(56) References Cited

U.S. PATENT DOCUMENTS 3,100,311 A 8/1963 Tutino
6,175,983 B1 * 1/2001 Hirose ................... B08B 1/007
  15/102

(Continued)

FOREIGN PATENT DOCUMENTS

JP H05-015857 A 1/1993
JP H09-134896 A 5/1997
(Continued)

OTHER PUBLICATIONS

Japan Patent Office, Notification of Reasons for Refusal in Japanese Patent Application No. 2018-108216 (dated Mar. 5, 2019).
Japan Patent Office, Decision to Grant a Patent in Japanese Patent Application No. 2014-235191 (dated Apr. 26, 2018).

*Primary Examiner* — Randall E Chin
(74) *Attorney, Agent, or Firm* — Leydig, Voit & Mayer, Ltd.

(57) ABSTRACT

A cleaning device, according to one embodiment, for cleaning a substrate by being rotated, includes: a cleaning member configured to clean a substrate; and a sleeve configured to be provided along a circumference of the cleaning member, a lower part of the sleeve being divided into a plurality of chucking claws each of which holds a portion of a side face of the cleaning member, wherein at inside of each of the plurality of chucking claws, a plurality of protrusions are provided substantially parallel to a rotation direction of the cleaning member, an end of each of the plurality of protrusions is configured to contact the side face of the cleaning member.

14 Claims, 15 Drawing Sheets

(51) Int. Cl.
  *B08B 1/04* (2006.01)
  *H01L 21/00* (2006.01)
  *A46B 9/00* (2006.01)
  *A46B 13/02* (2006.01)
  *B08B 1/00* (2006.01)
  *B08B 1/02* (2006.01)
  *B08B 3/04* (2006.01)
  *H01L 21/687* (2006.01)

(52) U.S. Cl.
  CPC ............... *B08B 1/02* (2013.01); *B08B 3/041* (2013.01); *B08B 11/00* (2013.01); *H01L 21/00* (2013.01); *H01L 21/67046* (2013.01); *H01L 21/67051* (2013.01); *H01L 21/68735* (2013.01); *H01L 21/68764* (2013.01)

(56) References Cited

U.S. PATENT DOCUMENTS

| | | |
|---|---|---|
| 6,412,134 B1 | 7/2002 | Oikawa |
| 6,651,287 B2 | 11/2003 | Oikawa et al. |
| D719,591 S | 12/2014 | Kurusu |
| 2002/0004962 A1 | 1/2002 | Oikawa et al. |

FOREIGN PATENT DOCUMENTS

| | | |
|---|---|---|
| JP | H10-135166 A | 5/1998 |
| JP | 2000-173966 A | 6/2000 |
| JP | 2002-028584 A | 1/2002 |
| JP | 2007-335909 A | 12/2007 |
| JP | 3192429 U | 7/2014 |

\* cited by examiner

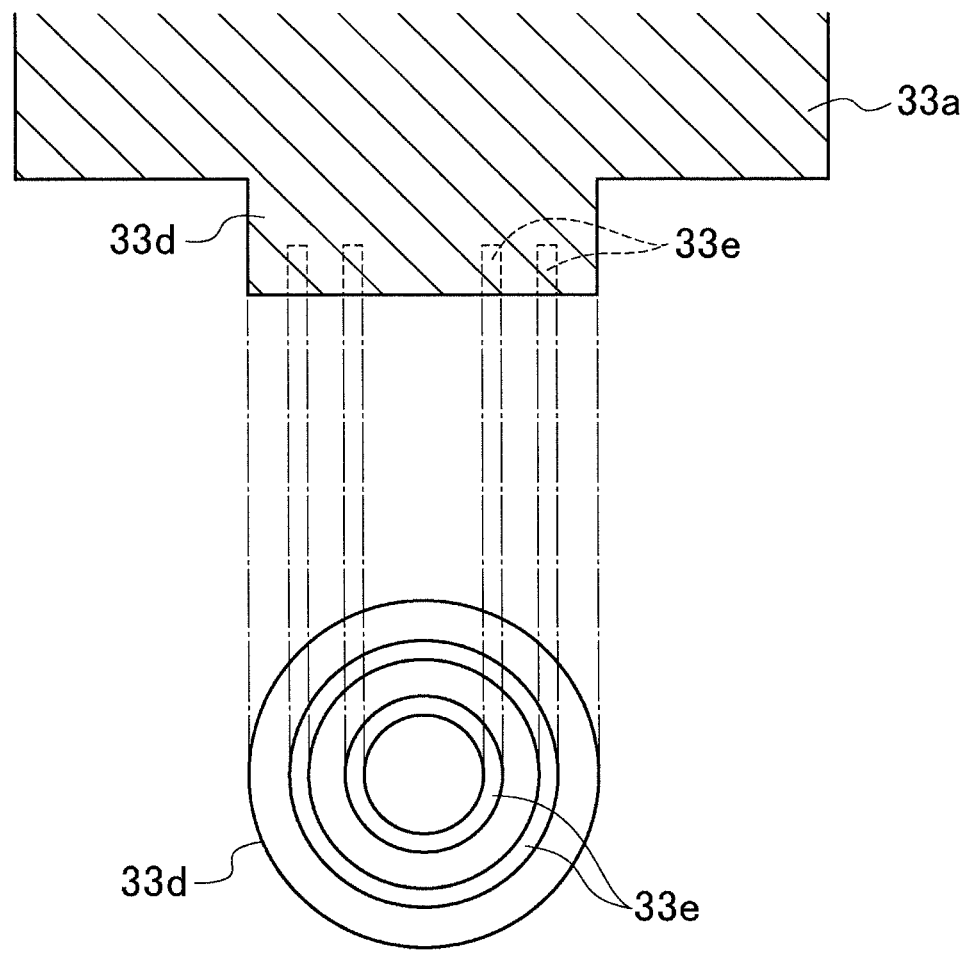

CLEANING DEVICE, METHOD OF MANUFACTURING THE SAME AND SUBSTRATE CLEANING APPARATUS

CROSS-REFERENCE TO RELATED APPLICATIONS

This patent application is a continuation of U.S. patent application Ser. No. 14/944,551, filed on Nov. 18, 2015, now U.S. Pat. No. 9,643,216, and claims the benefit of Japanese Priority Patent Application JP 2014-235191, filed on Nov. 20, 2014, both of which preceding patent applications are incorporated by reference.

FIELD

The present technology relates to a cleaning device for cleaning a substrate, a method of manufacturing the cleaning device, and a substrate cleaning apparatus.

BACKGROUND

JP 2000-173966 A discloses a substrate cleaning apparatus for cleaning a substrate such as a semiconductor wafer. The substrate cleaning apparatus cleans a surface of a semiconductor wafer with a rotating cleaning member making contact with a semiconductor wafer.

The typical size of semiconductor wafers used to be about 300 mm in diameter. In recent years, however, semiconductor wafers have become large in size and the semiconductor wafer with a diameter of 450 mm is becoming a mainstream of semiconductor wafers. Disadvantageously, for the substrate cleaning apparatus disclosed in JP 2000-173966 A, an apparatus that is simply increased in size cannot always ensure sufficient detergency. So there need some study to apply the substrate cleaning apparatus to clean large substrates.

Therefore, a cleaning device suitable for cleaning larger substrates, a method of manufacturing such a cleaning device, and a substrate cleaning apparatus using such a cleaning device are desired.

SUMMARY

A cleaning device, according to one embodiment, for cleaning a substrate by being rotated, includes: a cleaning member configured to clean a substrate; and a sleeve configured to be provided along a circumference of the cleaning member, a lower part of the sleeve being divided into a plurality of chucking claws each of which holds a portion of a side face of the cleaning member, wherein at inside of each of the plurality of chucking claws, a plurality of protrusions are provided substantially parallel to a rotation direction of the cleaning member, an end of each of the plurality of protrusions is configured to contact the side face of the cleaning member.

BRIEF DESCRIPTION OF DRAWINGS

FIG. 8 illustrates an exemplary modification of the protrusion 33d of the holding core 33.

FIGS. 10A and 10B are enlarged views of the inner face of the chucking claw 32a.

FIG. 12 is an enlarged view of another exemplary configuration of the inner face of the chucking claw 32a.

DESCRIPTION

Figure 1:
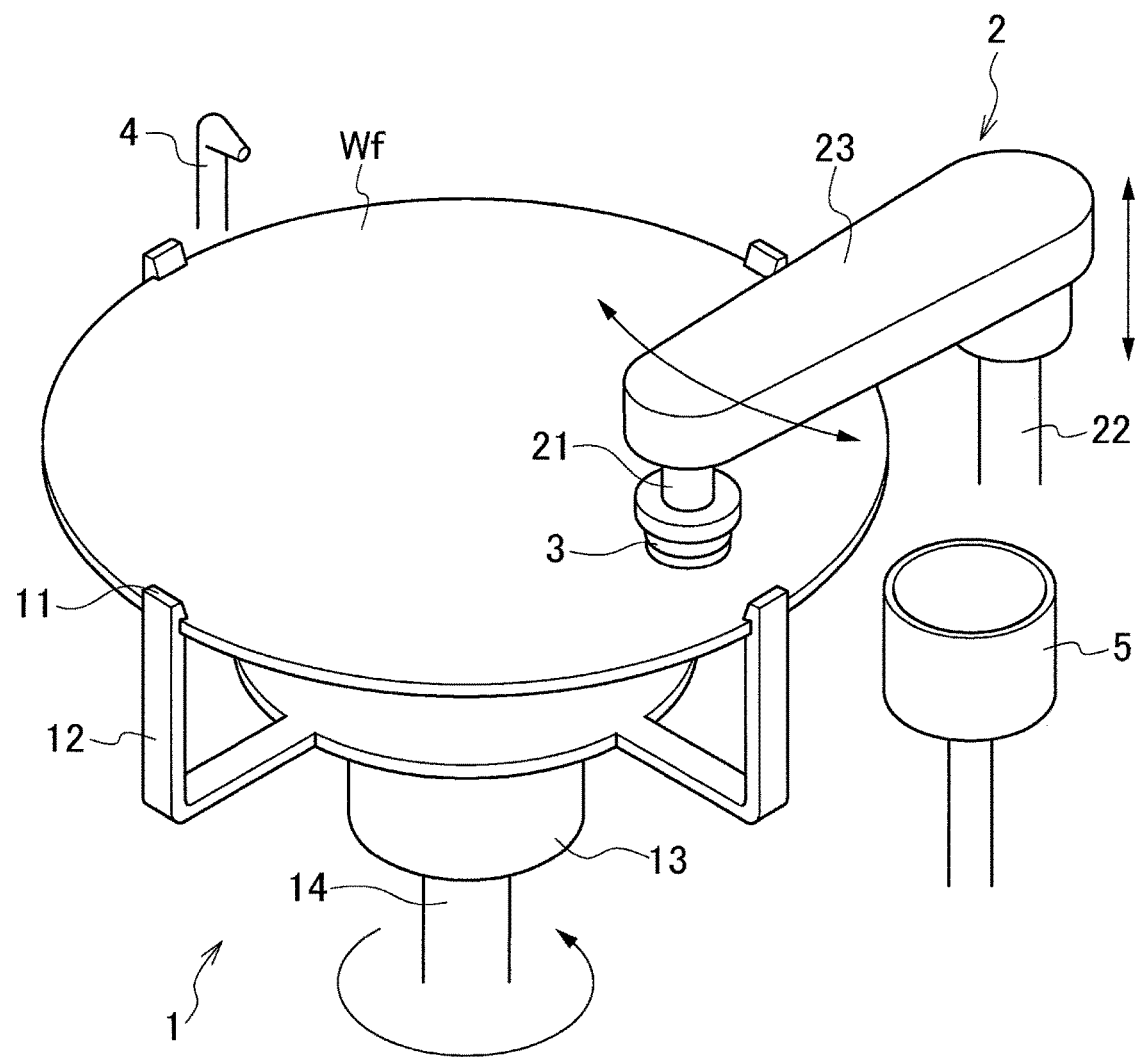
FIG. 1 is a perspective view illustrating a schematic configuration of a substrate cleaning apparatus.

Specific description will be presented below with reference to figures.

A cleaning device, according to one embodiment, for cleaning a substrate by being rotated, the cleaning device includes: a cleaning member configured to clean a substrate; and a sleeve configured to be provided along a circumference of the cleaning member, a lower part of the sleeve being divided into a plurality of chucking claws each of which holds a portion of a side face of the cleaning member, wherein at inside of each of the plurality of chucking claws, a plurality of protrusions are provided substantially parallel to a rotation direction of the cleaning member, an end of each of the plurality of protrusions is configured to contact the side face of the cleaning member.

By providing such protrusions, even when the cleaning member is large, the idle running of the cleaning device can be suppressed, thereby cleaning a large substrate.

Preferably, the plurality of protrusions are fixedly attached to the cleaning member, and the side face of the cleaning member is swelling into a gap between the plurality of protrusions. To realize this, the cleaning device further may include a ring member configured to fit at an outer circumference of the sleeve, wherein the plurality of protrusions are fixedly attached to the cleaning member by the ring member fitting at the outer circumference of the sleeve.

Preferably, the plurality of protrusions are configured to transfer driving force in the rotation direction to the cleaning member when the sleeve is rotationally-driven.

More preferably, at an inside face of each of the plurality of chucking claws, an additional protrusion is provided extending in a direction perpendicular to the rotation direction of the cleaning member at a position different from a position where the plurality of protrusions are provided, an end of the additional protrusion contacting the side face of the cleaning member. By this configuration, the effect to suppress the idle running improves.

The cleaning device may further comprise a positioning mechanism configured to position the cleaning member at a center of the sleeve. Furthermore, a recess may be provided on a substantial center of a top face of the cleaning member, and the cleaning device further comprises a holding core fixed to the sleeve, a convex portion being provided on a substantial center of a face of the holding core facing the top face of the cleaning member, the convex portion engaging with the recess. By such configuration, the cleaning member can be positioned at the center of the sleeve, so that eccentrically-rotation of the cleaning member can be suppressed, thereby extending the lifetime of the cleaning member.

Preferably, the top face of the cleaning member is arranged so that there exists a gap between the top face of the cleaning member and the face of the holding core facing the top face, the cleaning member has elasticity, and a height of the convex portion of the holding core is larger than a sum of a width of the gap and a depth of the recess in a status where the convex portion does not engage with the recess. By this configuration, since a downward pressure is applied on the center of the cleaning member, cleaning ability increases.

Preferably, a groove is provided on a face of the convex portion contacting a bottom face of the recess. Since the pressure is concentrated on the edge of the groove when the cleaning member rotates, the cleaning ability increases.

One of specific configurations, the cleaning member includes a lower column portion and a upper column portion, a radius of the upper column portion is smaller than a radius of the lower column portion, a bottom face of the lower column portion is a cleaning face, a top face of the lower column portion contacts a bottom face of the sleeve, a side face of the upper column portion is hold by the chucking claws, and the recess is provided on a top face of the upper column portion.

Preferably, at least a portion of a cross section of the recess has a straight line. By such configuration, the recess is easily formed and the line portion can transfer the driving ability in the rotation direction to the cleaning member.

A substrate cleaning apparatus according to another embodiment includes: a substrate holding and rotating mechanism configured to hold and rotate a substrate to be processed; the cleaning device of claim 1 configured to clean the substrate to be processed; and a cleaning device mounting mechanism on which the cleaning device is mounted and configured to rotate the cleaning device on the substrate to be processed.

A method for manufacturing a cleaning device according to another embodiment, the method includes: inserting a holding core into an opening on an upper part of a sleeve, a convex portion being provided on a substantial center of a bottom face of the holding core; inserting a cleaning member into an opening on a lower part of the sleeve divided into a plurality of chucking claws, a recess being provided on a substantial center of a top face of the cleaning member, to make the convex portion engage with the recess; and fitting a ring member at an outer circumference of the sleeve to bite a plurality of protrusion provided substantially parallel to a rotation direction of the cleaning member at inside of each of the plurality of chucking claws into the cleaning member.

Hereinafter, embodiments will be specifically explained.

FIG. 1 is a perspective view illustrating a schematic configuration of a substrate cleaning apparatus. The substrate cleaning apparatus includes a substrate holding and rotating mechanism 1, a cleaning device mounting mechanism 2, a cleaning device 3, a nozzle 4, and a container 5.

The substrate holding and rotating mechanism 1 holds and rotates a substrate to be processed Wf, such as a semiconductor wafer. More specifically, the substrate holding and rotating mechanism 1 includes a plurality of (the number of which is typically four, as shown in FIG. 1) arms 12 having a chuck 11 for holding the substrate Wf, a base 13 to which the arms 12 are integrally attached, and a rotating shaft 14 for rotating the base 13.

The cleaning device 3 is mounted on the cleaning device mounting mechanism 2. The cleaning device 3 is rotated on the substrate Wf and swung from the center to an edge (or from an edge to an edge) of the substrate Wf. More specifically, the cleaning device mounting mechanism 2 includes a rotating shaft 21 that rotates the cleaning device 3 attached to the distal end of the cleaning device mounting mechanism 2, a swing shaft 22 that swings and lifts or lowers the cleaning device 3, and a swing arm 23. The swing shaft 22 is fixed to an end of the swing arm 23, and the cleaning device 3 is attached to the other end of the swing arm 23 via the rotating shaft 21.

The cleaning device 3 making contact by its bottom surface with the surface of the substrate Wf swings and rotates to clean the substrate Wf to be processed. The present embodiment provides a substrate cleaning apparatus suitable for cleaning a large substrate Wf to be processed, for example, a semiconductor wafer having a diameter of 450 mm by improving the configuration of the cleaning device 3.

The nozzle 4 supplies cleaning liquid, such as pure water, onto the substrate Wf. The container 5 contains cleaning liquid for cleaning the cleaning device 3 that has cleaned the substrate Wf.

The substrate cleaning apparatus configured as described above is operated as described below. The cleaning liquid is ejected from the nozzle 4 onto the substrate to be processed Wf rotated by the rotating shaft 14 of the substrate holding and rotating mechanism 1. Simultaneously, the rotating shaft 21 of the cleaning device mounting mechanism 2 rotates the cleaning device 3 and the swing shaft 22 swings the rotating cleaning device 3 with the bottom face of the cleaning device 3 making contact with the surface of the substrate Wf. The substrate Wf is cleaned in this manner. When cleaning is finished, the swing shaft 22 swings the swing arm 23 to dip the cleaning device 3 in the cleaning liquid in the container 5. Meanwhile, the cleaned substrate Wf is spin-dried by being rotated at a high speed by the rotating shaft 14 of the substrate holding and rotating mechanism 1. After drying, the substrate Wf is conveyed by, for example, a robot arm (not shown) to the next processing.

The cleaning device 3 will now be described.

Figure 2:
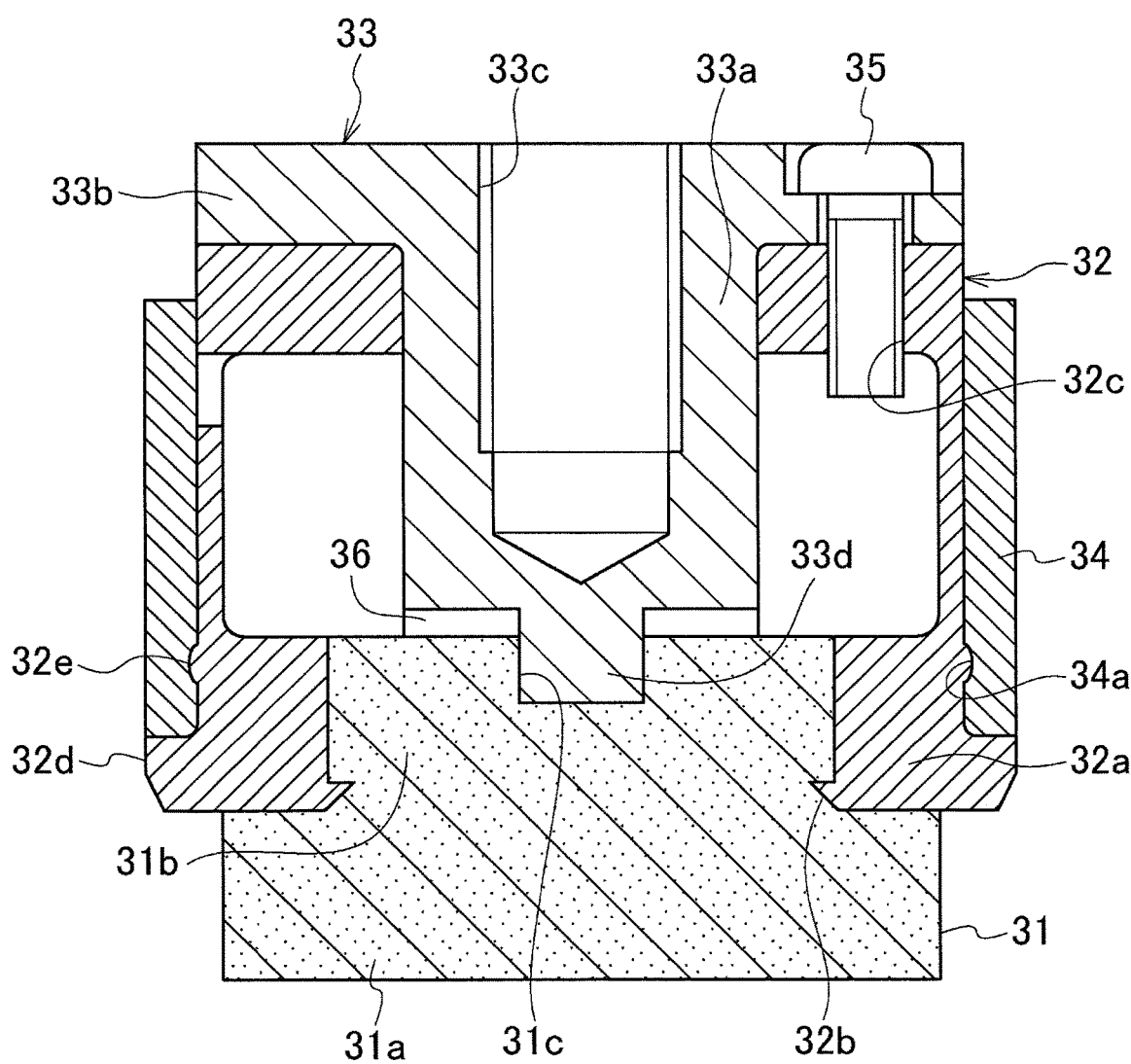
FIG. 2 is a sectional view of the cleaning device 3.
Figure 3:
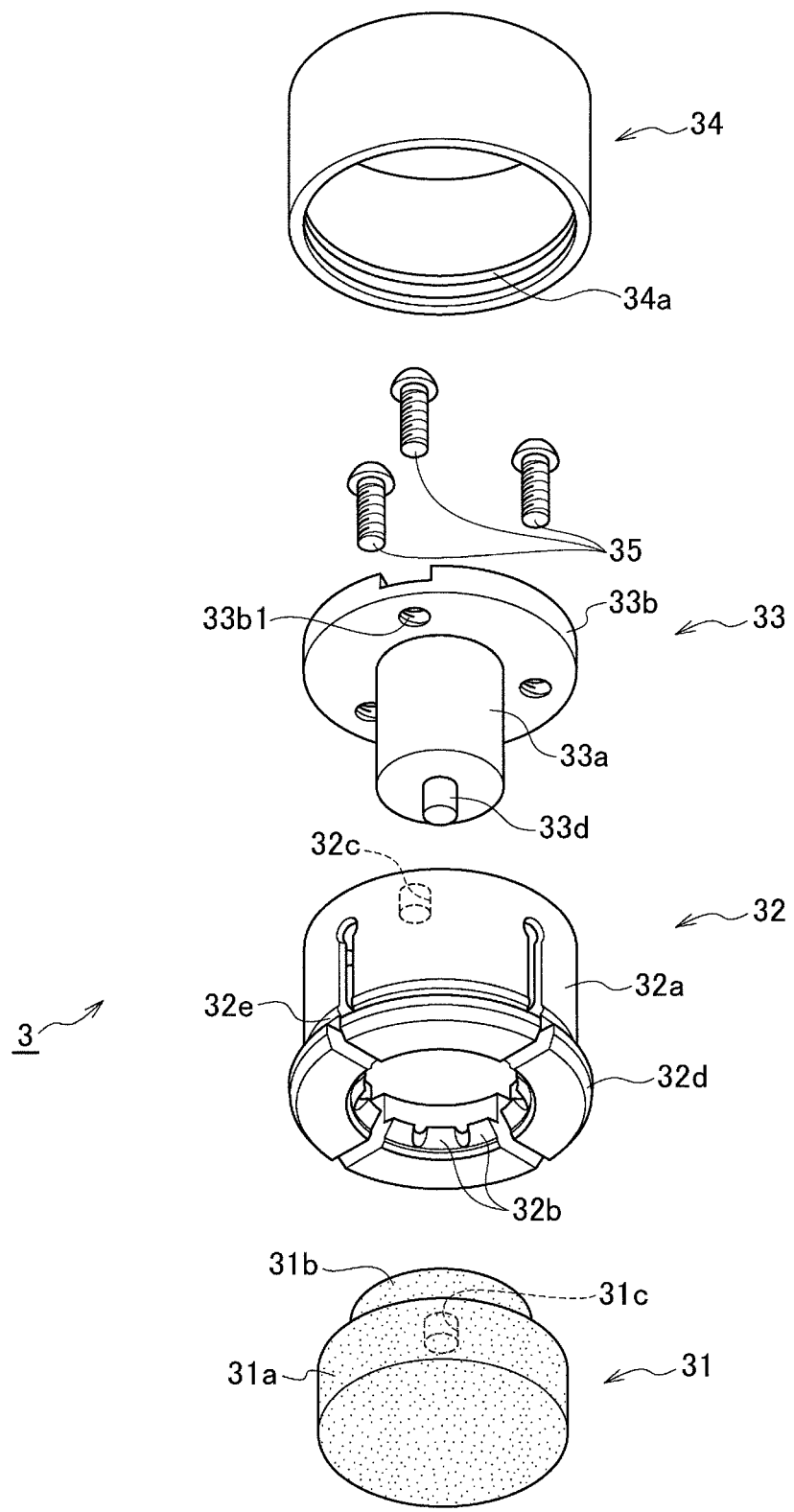
FIG. 3 is an exploded perspective view of the cleaning device 3.

FIGS. 2 and 3 are respectively a sectional view and an exploded perspective view of the cleaning device 3. The cleaning device 3 includes a cleaning member 31, a sleeve 32, a holding core 33, a ring member 34, and a screw 35.

The cleaning member 31 is formed of a soft porous material having elasticity and liquid absorptivity, such as a sponge (the substance of which is, for example, porous composition polyvinyl formal (PVF)) and polyvinyl alcohol (PVA). The cleaning member 31 is composed of a lower column portion 31a and an upper column portion 31b. The diameter of the upper column portion 31b is smaller than the diameter of the lower column portion 31a. The upper column portion 31b is concentrically positioned with the lower column portion 31a.

As illustrated in FIG. 2, the outer periphery of the top face of the lower column portion 31a makes contact with the bottom face of the sleeve 32 and receives downward pressure from the sleeve 32. The bottom face of the lower column portion 31a (i.e., the bottom face of the cleaning member 31) is the cleaning face. The substrate Wf to be processed is cleaned by the rotating cleaning face touching the surface of the substrate Wf. For a substrate Wf with a diameter of 450 mm, the diameter of the lower column portion 31a is, for example, about 42 mm.

The side face of the upper column portion 31b is held in the sleeve 32. The top face of the upper column portion 31b opposes the bottom face of the holding core 33 with a gap 36 therebetween. A recess 31c is provided approximately in the center of the top face of the upper column portion 31b.

The sleeve 32 has a top opening, a bottom opening, and a hollow. The top portion and the bottom portion of the sleeve 32 are thick, while the middle portion of the sleeve 32 is thin. As illustrated in FIG. 3, four cut grooves are provided in the outer circumference of the sleeve 32 to extend upward from the bottom end of the sleeve 32. By these cut grooves, the bottom portion of the sleeve 32 is divided into four chucking claws 32a.

The upper column portion 31b of the cleaning member 31 is inserted from the bottom opening of the sleeve 32 to position the chucking claws 32a on the circumference of the cleaning member 31. To make insertion of the cleaning member 31 easy, the chucking claws 32a may slightly be expanded outward when the ring member 34, which will be described later, is not fitted.

As illustrated in FIG. 2, a plurality of protrusions 32b that makes contact by the distal end with the side face of the cleaning member 31 is provided on the inner face of the chucking claw 32a. The cleaning member 31 can surely be held by these protrusions 32b. The chucking claw 32a has on its upper portion a screw hole 32c into which a screw 35 is screwed. The chucking claw 32a has on its lower portion a protrusion 32d that protrudes outward. A protrusion 32e that is smaller in protruding height than the protrusion 32d is provided in the upper side of the protrusion 32d.

The holding core 33 includes a column portion 33a and a brim portion 33b provided on the upper side of the column portion 33a. The brim portion 33b has a larger outer diameter than the column portion 33a. The brim portion 33b is provided with a through hole 33b1 through which the screw 35 is inserted. The through hole 33b1 is provided so as to be above the screw hole 32c of the sleeve 32. The screw 35 is screwed into the screw hole 32c of the sleeve 32 through the through hole 33b1 to secure the holding core 33 to the sleeve 32.

A recess 33c is formed in the column portion 33a. The distal end of the rotating shaft 21 (see FIG. 1) which holds and rotates the cleaning device 3 engages with the recess 33c. The holding core 33 and the sleeve 32 secured to the holding core 33 are rotated together by the rotation of the rotating shaft 21. A protrusion 33d that engages with the recess 31c of the cleaning member 31 is provided approximately in the center of the bottom face of the column portion 33a. In a region where the protrusion 33d is not provided, the gap 36 exists between the bottom face of the column portion 33a and the portion of the top face of the cleaning member 31.

The ring member 34 is a cylindrical body having the inner diameter approximately identical to the outer diameter of the sleeve 32 and fits on the external of the sleeve 32. A groove 34a provided in the inner circumferential face of the ring member 34 engages with the protrusion 32e of the chucking claw 32a, and the protrusion 32d of the sleeve 32 supports the bottom face of the ring member 34. The ring member 34 constricts inward the chucking claw 32a of the sleeve 32.

The recess 31c on the top face of the cleaning member 31 and the protrusion 33d on the bottom face of the holding core 33, which are one of the features of the cleaning device 3, will now be described in detail.

Figure 4:
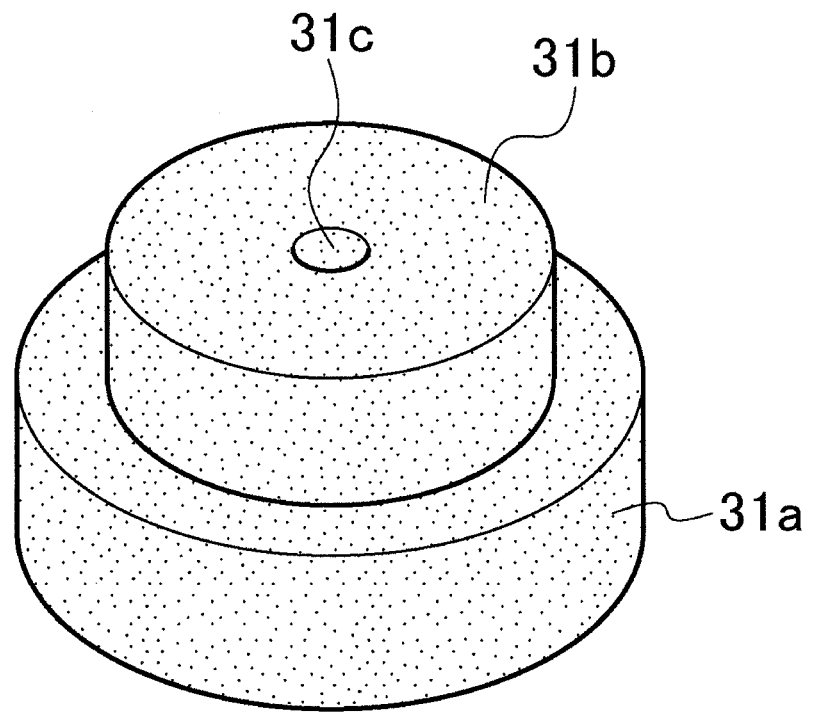
FIG. 4 is a perspective view of the cleaning member 31.
Figure 5A:
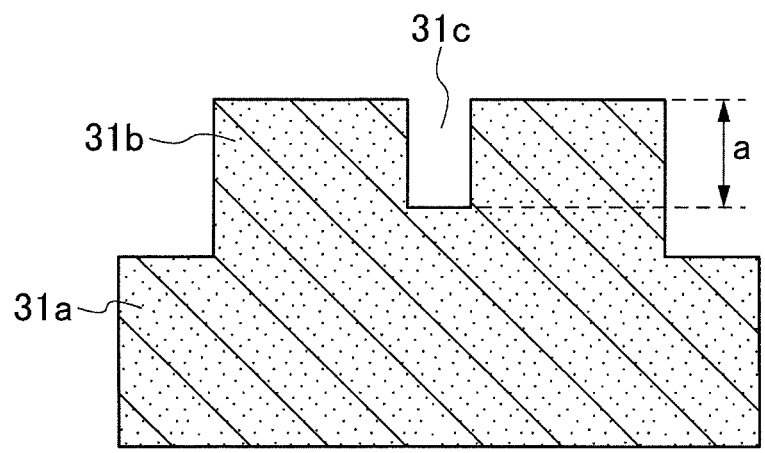
FIGS. 5A and 5B are vertical sectional views of the cleaning member 31 including its center.
Figure 5B:
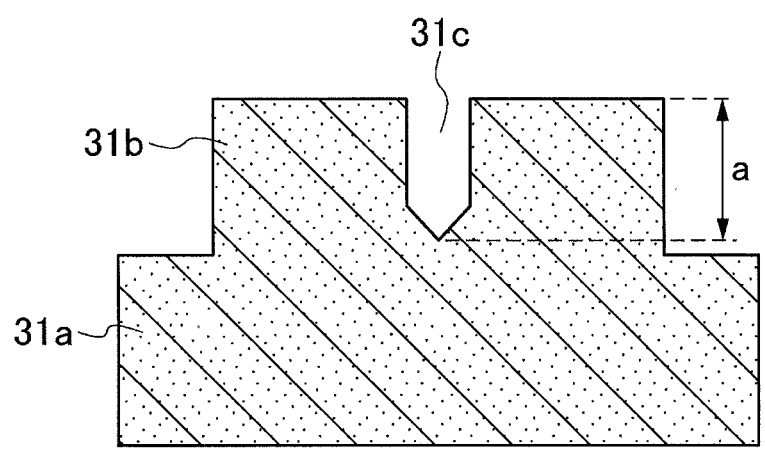

FIG. 4 is a perspective view of the cleaning member 31. FIGS. 5A and 5B are sectional views of the cleaning member 31 including its center. As illustrated in FIG. 4, the recess 31c is provided approximately in the center of the top face of the cleaning member 31. The recess 31c has a width (diameter) of, for example, approximately 15% of the diameter of the upper column portion 31b. Although FIG. 4 illustrates the recess 31c having a circular horizontal cross section, the horizontal cross section may be a polygonal shape, such as a triangular shape. The vertical cross section of the recess 31c may be a rectangular shape as illustrated in FIG. 5A. Alternatively, the recess 31c may have a sharp bottom that becomes deeper from the outer edge to the center, as illustrated in FIG. 5B. The depth of the recess 31c in the cleaning member 31, which has elasticity, is "a" when no external force is applied to the cleaning member 31. The depth "a" is, for example, approximately 60% of the height of the upper column portion 31b.

Figure 6A:
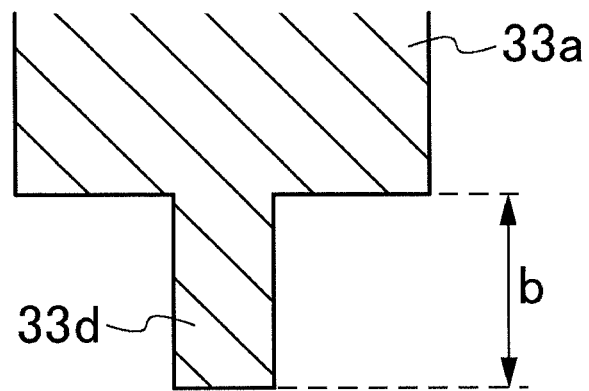
FIGS. 6A and 6B are enlarged views illustrating the bottom face of the column portion 33a of the holding core 33.
Figure 6B:
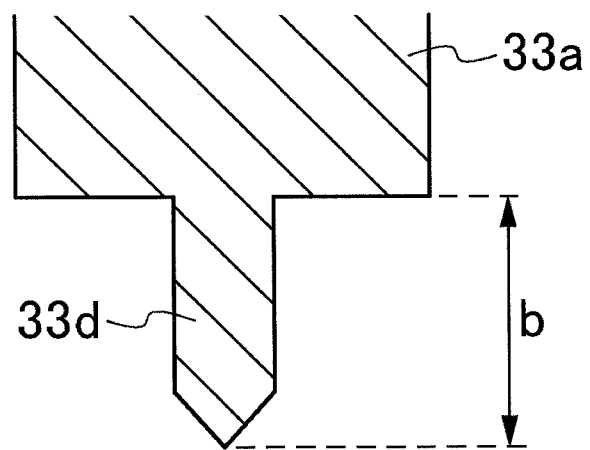

FIGS. 6A and 6B are enlarged views illustrating the bottom face of the column portion 33a of the holding core 33. As illustrated in the figure, a protrusion 33d that engages with the recess 31c of the cleaning member 31 is provided approximately in the center of the bottom face of the column portion 33a. The protrusion 33d has a shape corresponding to the shape of the recess 31c of the cleaning member 31. If the recess 31c has a rectangular shape as illustrated in FIG. 5A, the protrusion 33d also has the rectangular shape (see FIG. 6A). If the recess 31c has a shape with a sharp bottom as illustrated in FIG. 5B, the protrusion 33d also has a shape with a sharp distal end (see FIG. 6B). The height of the protrusion 33d, namely the distance from the bottom face of the column portion 33a to the distal end of the protrusion 33d, is "b".

Figure 7A:
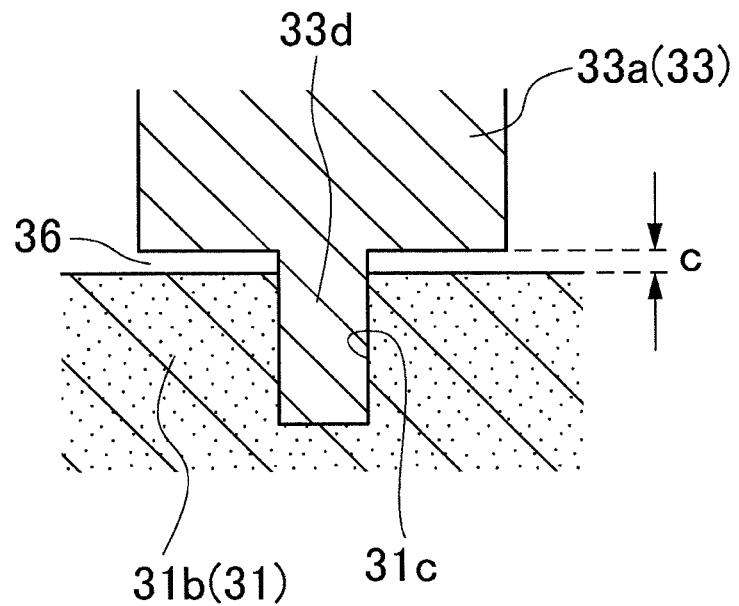
FIGS. 7A and 7B are enlarged views of the top face of the cleaning member 31 and the bottom face of the holding core 33.
Figure 7B:
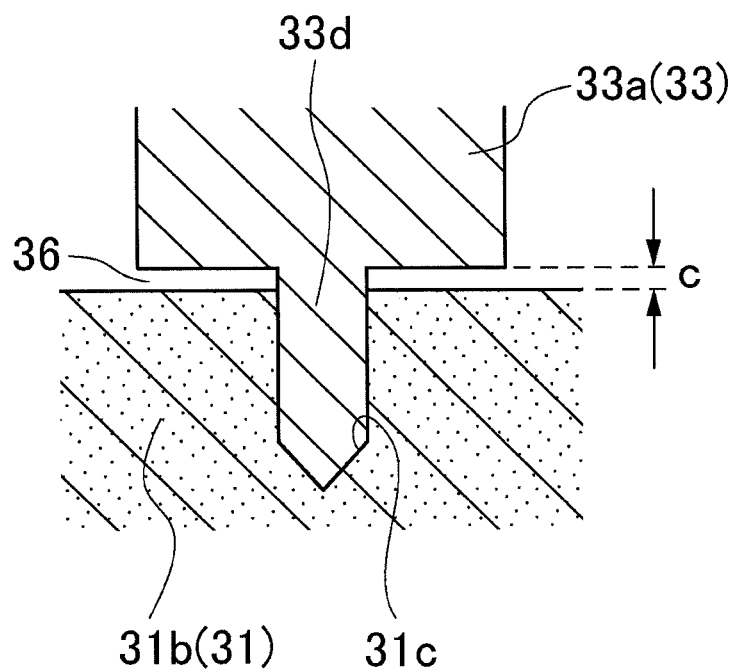

FIGS. 7A and 7B are enlarged views of the top face of the cleaning member 31 and the bottom face of the holding core 33. FIG. 7A corresponds to FIG. 5A and FIG. 6A. FIG. 7B corresponds to FIG. 5B and FIG. 6B. As illustrated in the drawings, the gap 36 exists between the top face of the upper column portion 31b of the cleaning member 31 and the bottom face of the column portion 33a of the holding core 33. By providing the gap 36, a possible production error in the height of the cleaning member 31 can be canceled. The height of the gap 36 is "c". The protrusion 33d of the holding core 33 engages with the recess 31c of the cleaning member 31.

If the recess 31c of the cleaning member 31 and the protrusion 33d of the holding core 33 are not provided, the correct positioning of the cleaning member 31 to the holding core 33 is difficult, in particular, for a larger cleaning member 31 used for cleaning a larger substrate Wf. For example, when the center of the cleaning member 31 and the center of the holding core 33 are misaligned, the cleaning member 31 cannot be caught firmly by the chucking claw 32a of the sleeve 32. When the cleaning member 31 is rotated about an eccentric axis, the cleaning member 31 might wear within a short time.

In the embodiment, the holding core 33 is provided with the protrusion 33d and the cleaning member 31 is provided with the recess 31c. With the protrusion 33d and the recess 31c functioning as a mechanism for positioning the cleaning member 31 to the center of the sleeve 32, the cleaning member 31 can accurately be positioned in the center of the holding core 33. When the recess 31c has a shape illustrated in FIG. 5B, the cleaning member 31 can be positioned further correctly.

To achieve such positioning, the depth "a" of the recess 31c, the height "b" of the protrusion 33d, and the height "c" of the gap 36 are determined such that at least the distal end of the protrusion 33d reaches the recess 31c. More preferably, at least one of the depth "a" of the recess 31c, the height "b" of the protrusion 33d, and the height "c" of the gap 36 is determined so as to satisfy Equation 1 expressed below.

$$b > a + c \qquad \text{Equation 1}$$

When the relationship expressed by Equation 1 is satisfied, the distal end of the protrusion 33*d* of the holding core 33 surely reaches the bottom of the recess 31*c* of the cleaning member 31, and thus the protrusion 33*d* applies a downward pressure to the cleaning member 31. In this manner, the central portion of the cleaning member 31 is pressed by the substrate to be processed Wf, thereby enhancing detergency. In particular, by increasing the difference between the left hand side "b" of Equation 1 and the right hand side "a+c" of Equation 1, the central portion of the cleaning member 31 applies a greater load to the substrate to be processed Wf.

When Equation 1 is not satisfied, the substrate Wf presses mostly the outer peripheral portion of the cleaning member 31 which is the portion pressed by the bottom face of the sleeve 32, as illustrated in FIG. 2. The area of the outer peripheral portion is almost the same for a cleaning member which is formed by simply enlarging a conventional small-sized cleaning member. Therefore, a large substrate Wf might not be cleaned sufficiently.

In the embodiment, the protrusion 33*d* of the holding core 33 presses the central portion of the cleaning member 31, so that the substrate Wf is cleaned also by the central portion in addition to the outer peripheral portion of the cleaning member 31. The embodiment is thus preferable for cleaning a large substrate Wf.

FIG. 8 illustrates an exemplary modification of the protrusion 33*d* of the holding core 33. FIG. 8 is a sectional view and is a bottom view of the protrusion 33*d*. For example, one or more annular grooves 33*e* may be provided in the bottom face of the protrusion 33*d*. When contamination by loading at or near the center of the cleaning member 31 where rotation is substantially zero is a concern, a recess may be provided in the bottom face of the protrusion 33*d* to avoid the center of the cleaning member 31 pressing the substrate Wf.

When the groove 33*e* is provided, the edge of the groove 33*e* slides across the surface of the substrate Wf when the cleaning member 31 swings. This motion produces concentration of force at the edge, which increases detergency. If the groove 33*e* is provided, the surface of the cleaning member 31 may be flat. Even if the rotation of the cleaning member 31 runs idle, the substrate to be processed Wf can be cleaned by the groove 33*e* if at least the cleaning member 31 swings.

FIGS. 9A to 9F illustrate exemplary modifications of the recess 31*c* of the cleaning member 31. Every drawing is a top view of the upper column portion 31*b* of the cleaning member 31.

Figure 9A:
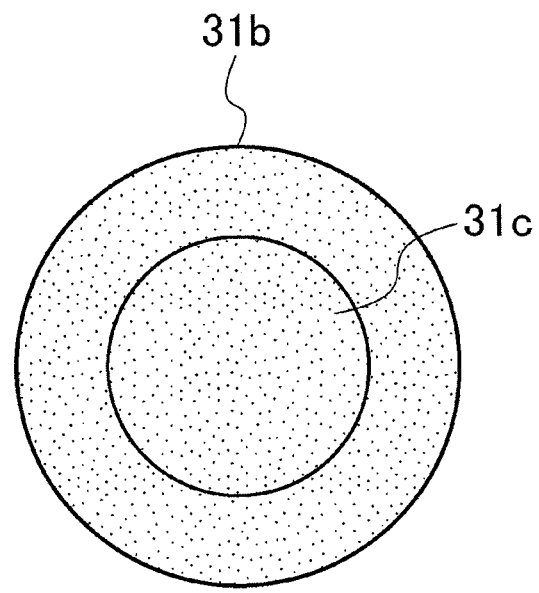
FIGS. 9A, 9B, 9C, 9D, 9E and 9F illustrate exemplary modifications of the recess 31c of the cleaning member 31.

The recess 31*c* is preferably formed to have a large diameter, specifically 50% or more of the diameter of the upper column portion 31*b* as illustrated in FIG. 9A, if such recess can be manufactured. In such a configuration, the cleaning member 31 can press the substrate Wf by a larger area, thereby improving detergency.

Figure 9B:
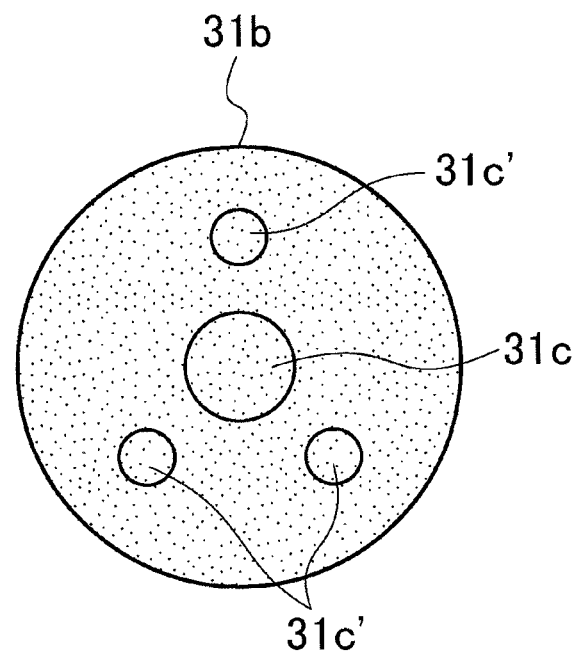
Figure 9C:
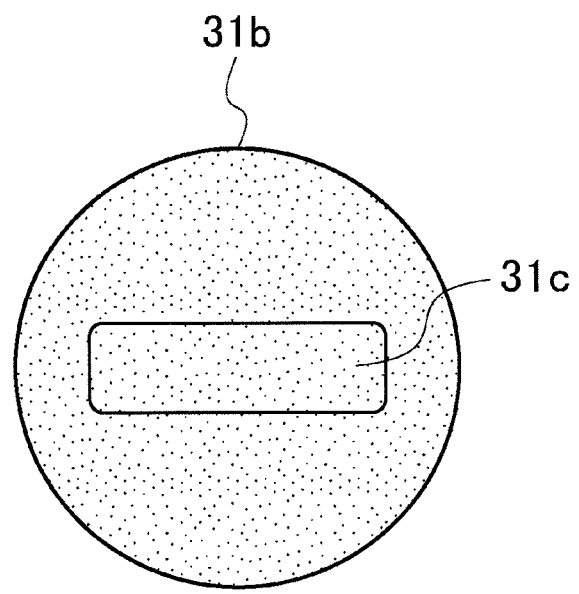
Figure 9D:
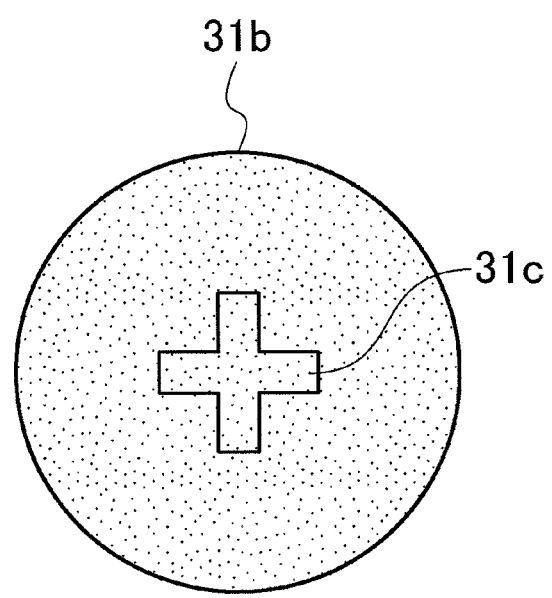
Figure 9E:
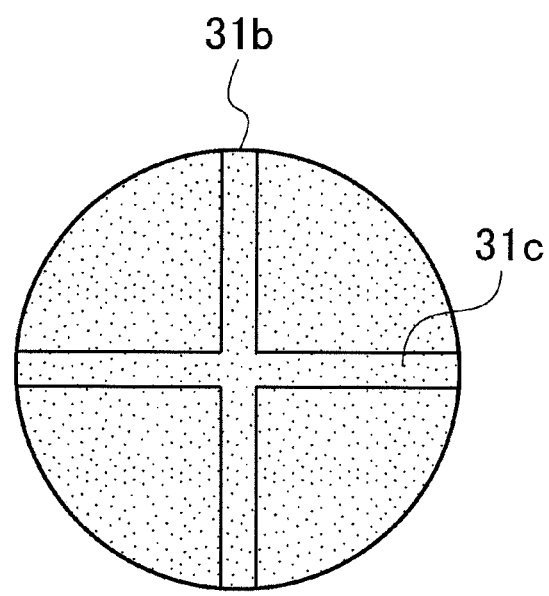
Figure 9F:
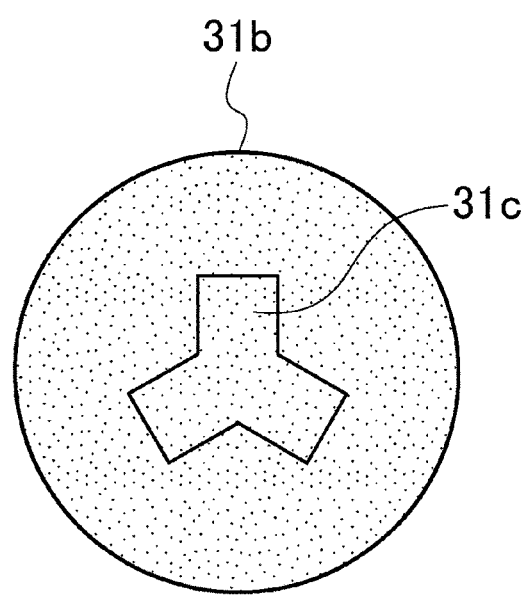

Not only in the center of the upper column portion 31*b*, a plurality of recesses 31*c'* may be provided evenly around the recess 31*c* as illustrated in FIG. 9B. In such a configuration, even when the recess 31*c* in the center is small, the cleaning member 31 can press the substrate to be processed Wf by a larger area.

As illustrated in FIGS. 9C to 9F, a portion of or preferably the entire cross section of the recess 31*c* has a shape formed of straight lines, because the recess 31*c* having such a shape can easily be created in the cleaning member 31 by processing. In addition, the shape formed mostly of straight lines is advantageous in that the straight portion of the recess 31*c* transmits the rotational force of the holding core 33 to the cleaning member 31. Moreover, further larger portion of the cleaning member 31 is pressed onto the substrate to be processed Wf, distributing the pressure on the cleaning member 31 and thus extending the lifetime of the cleaning member 31.

The specific shape of the recess 31*c* is not particularly limited. The shape of the recess 31*c* may be a rectangular shape that includes the center of the upper column portion 31*b* (see FIG. 9C), a cross-shape (see FIG. 9D), a cross-shape reaching the edge of the upper column portion 31*b* (see FIG. 9E), or a shape composed of a plurality of (three, for example) lines extending from the center toward the rim (see FIG. 9F). For any shape, the central portion of the upper column portion 31*b* is preferably depressed to provide a function of positioning.

The protrusion 33*d* of the holding core 33 is formed to have a shape corresponding to the shape of the recess 31*c* of the cleaning member 31.

The protrusion 32*b* on the inner face of the chucking claw 32*a*, which is another feature of the cleaning device 3, will now be described in detail.

Figure 10A:
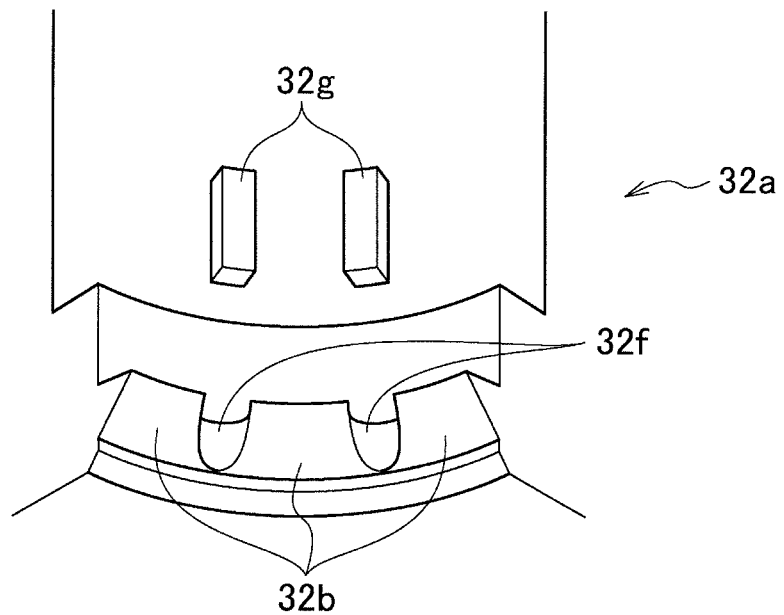
Figure 10B:
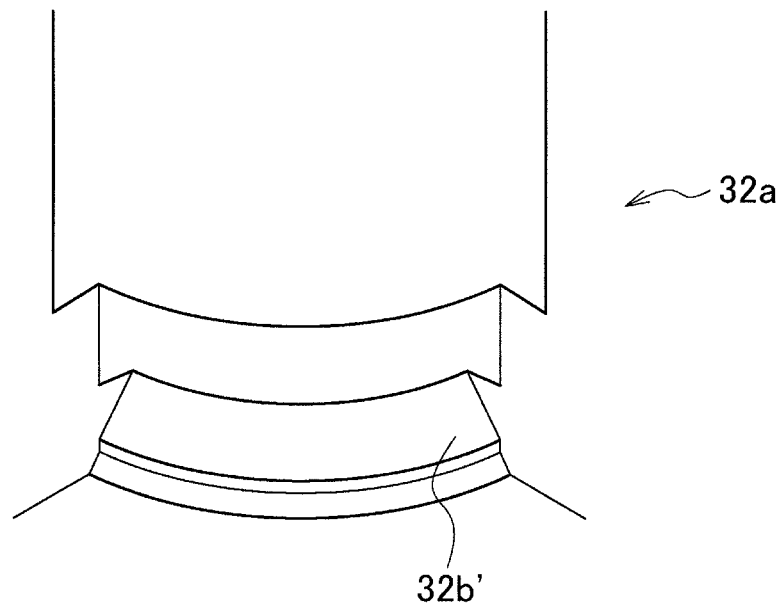

FIGS. 10A and 10B are enlarged views of the inner face of the chucking claw 32*a*. As illustrated in FIG. 10A, the bottom end of the chucking claw 32*a* is provided with a plurality of (three, in FIG. 10A) protrusions 32*b* extending inward. The protrusions 32*b* are arranged along the rotational direction of the cleaning member 31, namely approximately parallel to the horizontal plane or a cleaning face of the cleaning member 31. A gap 32*f* is provided between the protrusions 32*b*. The width of the protrusion 32*b* may be larger than or almost equal to the gap 32*f*. The outermost of the gap 32*f* in the radial direction of the sleeve 32 may be on the inner face of the chucking claw 32*a*.

The protrusions 32*b* is formed by, for example, removing portions corresponding to the gap 32*f* from a single seamless protrusion 32*b'* without any gap 32*f* as illustrated in FIG. 10B. The protrusion 32*b* may be provided on the chucking claw 32*a* in an integrated manner or as a separate member.

A protrusion 32*g* extending in the vertical direction, that is, the direction approximately perpendicular to the cleaning face of the cleaning member 31 may be provided above the gap 32*f* (or the protrusion 32*b*) on the inner face of the chucking claw 32*a*.

Figure 11:
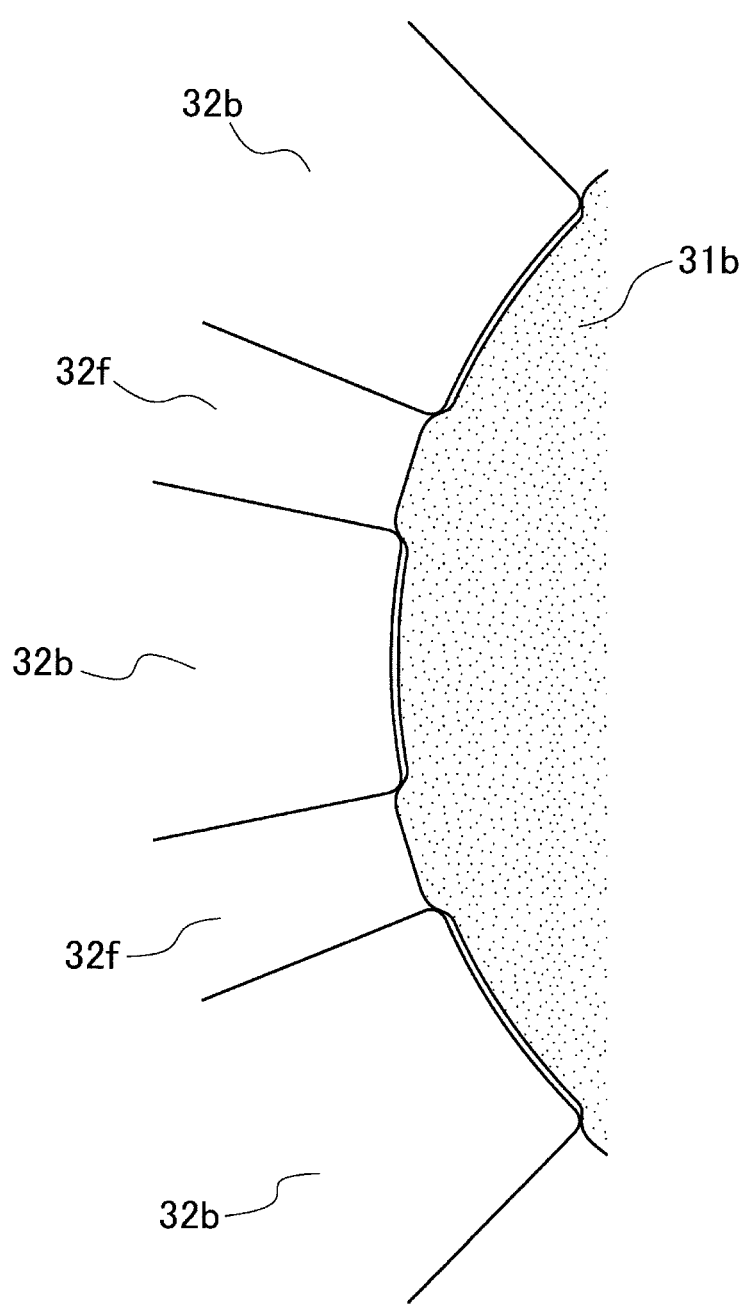
FIG. 11 is a top view of the chucking claw 32a catching the upper column portion 31b of the cleaning member 31.

FIG. 11 is a top view of the chucking claw 32*a* catching the upper column portion 31*b* of the cleaning member 31. By fitting the ring member 34 onto the outer circumference of the sleeve 32, the chucking claw 32*a* is pushed inward. With this push, the elastic cleaning member 31 deforms, allowing the protrusion 32*b* biting into the side face of the upper column portion 31*b* and the side face of the upper column portion 31*b* swelling into the gap 32*f*.

To deform the cleaning member 31 in this manner, it is preferable to correctly position the cleaning member 31 to the center of the arrangement of chucking claws 32*a* by using the recess 31*c* of the cleaning member 31 and the protrusion 33*d* of the holding core 33, so that the cleaning member 31 can be caught evenly by four chucking claws 32*a*. When the cleaning member 31 is misaligned from the center, the protrusion 32*b* of the chucking claw 32*a* far from the center cannot firmly catch the cleaning member 31.

When the rotating shaft 21 of the cleaning device mounting mechanism 2 rotates to rotatably-drive the holding core 33 and the sleeve 32 with keeping the state illustrated in FIG. 11, the protrusion 32*b* transmits the rotational force to the cleaning member 31. With this transmission, an idle running, that is a stop of rotation of the cleaning member 31 occurring while the holding core 33 and the sleeve 32 are rotating, can be suppressed. The substrate to be processed Wf can thereby be cleaned efficiently.

When the cleaning member 31 is caught by a single seamless protrusion extending along the rotational direction (see FIG. 10B) instead of by a plurality of protrusions 32b, the rotational force is not sufficiently transmitted to the cleaning member 31, which may cause the cease of rotation of the cleaning member 31. In particular, when a large cleaning member 31 is used for a large substrate to be processed Wf, the cease of rotation is more likely to happen because the rotational speed at the outer circumference of the cleaning member 31 is high.

In the embodiment, a plurality of protrusions 32b arranged along the direction parallel with the cleaning face (i.e., the rotational direction) is provided on the inner face of the chucking claw 32a. The protrusions 32b functions as a rotation-cease preventing mechanism to prevent a cease of rotation.

Figure 12:
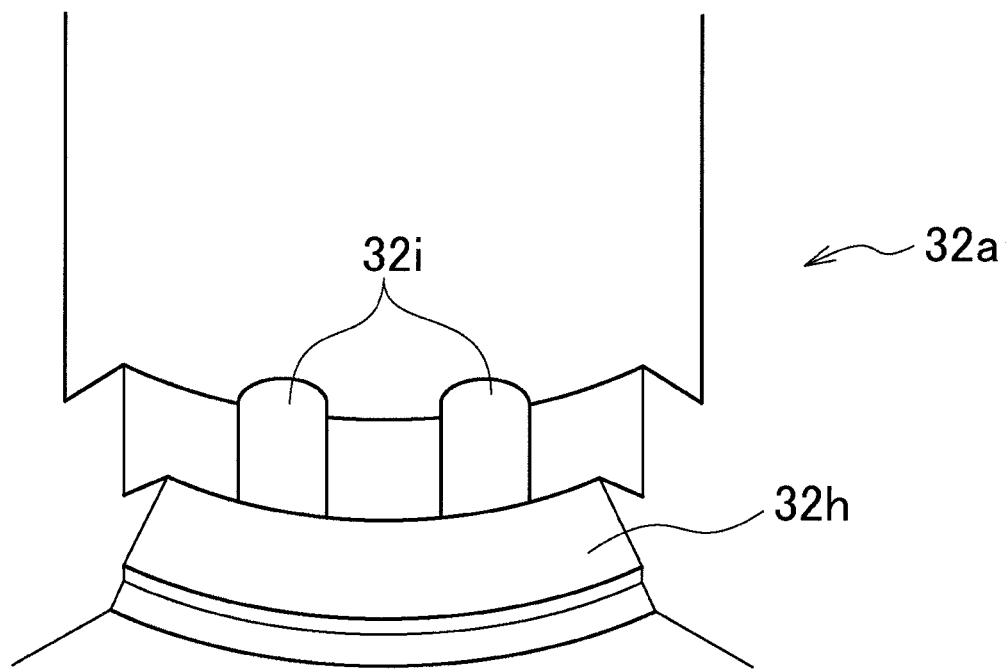

FIG. 12 is an enlarged view of another exemplary configuration of the inner face of the chucking claw 32a. As illustrated in the figure, a protrusion 32h protruding inward is provided on the bottom end of the chucking claw 32a. In addition, a plurality of (typically the number of the protrusions is two, as shown in FIG. 12) protrusions 32i protruding inward is provided above the protrusion 32h. The protrusions 32i are arranged along the rotational direction of the cleaning member 31, namely approximately parallel to the horizontal plane or the cleaning face of the cleaning member 31.

As illustrated in FIGS. 10A and 12, the chucking claw 32a at least has an inward protrusion.

A method of manufacturing, i.e. providing the cleaning device 3 by assembling the cleaning member 31, the sleeve 32, the holding core 33, and the ring member 34 will now be described.

Figure 13:
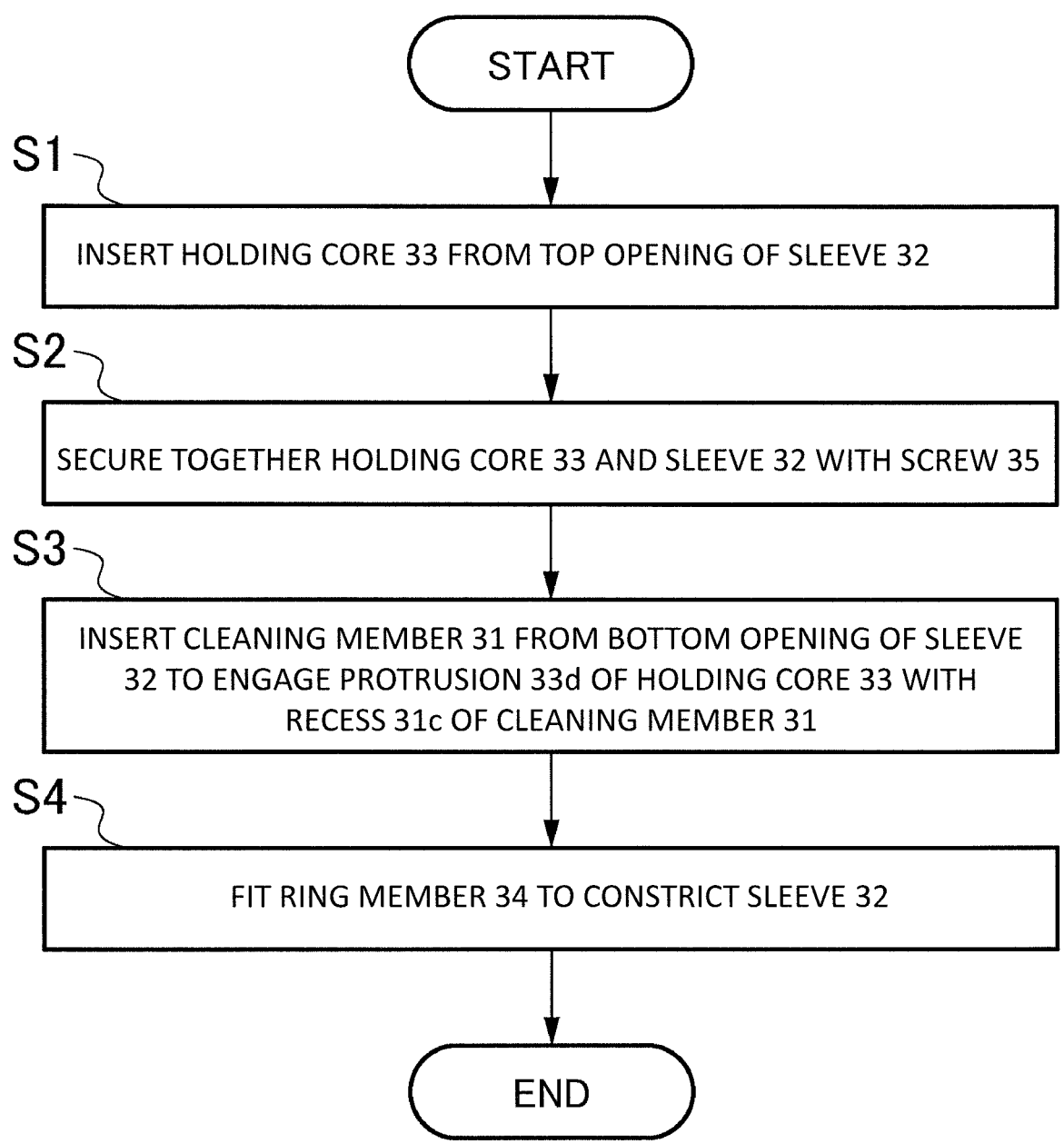
FIG. 13 is a process chart illustrating a method of manufacturing the cleaning device 3.

FIG. 13 is a process chart illustrating a method of manufacturing the cleaning device 3. First, the column portion 33a of the holding core 33 is inserted in the sleeve 32 from the top opening until the bottom face of the brim portion 33b touches the top face of the sleeve 32 (step S1). The protrusion 33d of the holding core 33 is thus positioned inside the sleeve 32.

The screw 35 is screwed into the screw hole 32c of the sleeve 32 through the through hole 33b1 of the holding core 33 to secure together the holding core 33 and the sleeve 32 (step S2).

The upper column portion 31b of the cleaning member 31 is inserted from the bottom opening of the sleeve 32 until the top face of the lower column portion 31a touches the bottom face of the sleeve 32 and the protrusion 33d of the holding core 33 engages with the recess 31c provided on the top face of the upper column portion 31b (step S3). The cleaning member 31 is thus precisely positioned in the center of the sleeve 32. At this state, the protrusion 32b on the inner face of the chucking claw 32a need not touch the cleaning member 31.

Then the ring member 34 is fitted onto the outer circumference of the sleeve 32 (step S4). In this step, the sleeve 32 is constricted and the protrusion 32b bites into the side face of the cleaning member 31 as illustrated in FIG. 11. The cleaning member 31 is thus fixedly or firmly attached to the sleeve 32.

In a manner similar to the method of manufacturing the cleaning device 3 illustrated in FIG. 13, the cleaning member 31, which is an expendable part, can be replaced.

In the embodiment as described above, a plurality of protrusions 32b arranged along the rotational direction of the cleaning face is provided on the inner face of the chucking claw 32a. Thus, the cleaning member 31 is fixedly or firmly attached to the sleeve 32 and a cease of rotation can be suppressed even for a large cleaning member 31. Furthermore, the recess 31c is provided in the top face of the cleaning member 31 and the protrusion 33d that engages with the recess 31c is provided on the holding core 33 so as to position the cleaning member 31 in the center of the sleeve 32, thereby improving the effect of preventing a cease of rotation and extending the lifetime of the cleaning member 31. Moreover, when a long protrusion 33d is used, a downward force can be appropriately applied to the central portion of the cleaning member 31, resulting in improvement of detergency of cleaning processor, improvement of ability of cleaning device for cleaning the substrate Wf. With the substrate cleaning apparatus using the cleaning device 3 described above, a larger substrate Wf can be cleaned with high detergency.

The embodiment is described above to explain that a person skilled in the art in the technical field including the invention can set forth the present invention. Various modifications of the embodiment can naturally be made by a person skilled in the art, and the technical idea of the present invention can be applied to other embodiments. Thus, the present invention is not limited to the embodiment described above. The scope of the present invention should be construed by the broadest range according to the technical idea defined by the claims.

The invention claimed is:

1. A cleaning member holding apparatus configured to hold a cleaning member, wherein the cleaning member comprises:
    a bigger diameter portion comprising a cleaning surface; and
    a smaller diameter portion comprising a first surface facing opposite the cleaning surface on which at least one recess is provided;
    the cleaning member holding apparatus comprising:
    a chuck member configured to hold a side face of the smaller diameter portion; and
    at least one protrusion configured to be inserted into the recess,
    wherein the bigger diameter portion and the smaller diameter portion are formed of a soft porous material having elasticity and liquid absorptivity.

2. The cleaning member holding apparatus according to claim 1 further comprising a second surface from which the protrusion is projected, the second surface facing the first surface, there being a gap between the first surface and the second surface.

3. The cleaning member holding apparatus according to claim 2, wherein a relationship b>a+c is satisfied, where the "a" is a depth of the recess, the "b" is a length of the protrusion, and the "c" is a height of the gap.

4. The cleaning member holding apparatus according to claim 1 further comprising a plurality of the protrusion.

5. The cleaning member holding apparatus according to claim 1, wherein a groove is provided on the protrusion.

6. The cleaning member holding apparatus according to claim 1, wherein an annular groove is provided on the protrusion.

7. The cleaning member holding apparatus according to claim 1, wherein the protrusion comprises a sharp distal end.

8. The cleaning member holding apparatus according to claim 1, wherein a concave portion is provided on a center of a bottom surface of the protrusion.

9. The cleaning member holding apparatus according to claim 1, wherein at least a part of a cross section of the protrusion is formed of a straight line.

10. The cleaning member holding apparatus according to claim 1, wherein the chuck member is a chuck claw.

11. A cleaning member comprising:
- a bigger diameter portion comprising a cleaning surface; and
- a smaller diameter portion comprising a first surface facing opposite the cleaning surface on which at least one recess is provided;
- wherein the at least one recess being configured to receive a protrusion of a cleaning member holding apparatus, and
- wherein the bigger diameter portion and the smaller diameter portion are formed of a soft porous material having elasticity and liquid absorptivity, and
- wherein the protrusion is projected from a second surface of the cleaning member holding apparatus, the second surface facing the first surface, there being a gap between the first surface and the second surface and a relationship b>a+c is satisfied, where the "a" is a depth of the recess, the "b" is a length of the protrusion, and the "c" is a height of the gap.

12. The cleaning member according to claim 11, wherein a plurality of the recess are provided on the first surface.

13. The cleaning member according to claim 11, wherein a bottom of the recess is tapered.

14. The cleaning member according to claim 11, wherein at least a part of a cross section of the recess is formed of a straight line.

* * * * *